(12) United States Patent
Courtney et al.

(10) Patent No.: US 7,042,744 B2
(45) Date of Patent: May 9, 2006

(54) DIODE STACK

(75) Inventors: David Francis Courtney, Camarillo, CA (US); Gary Bridges, Moorpark, CA (US); Albin Gary Stanulis, Thousand Oaks, CA (US); Todd Allan Albright, Mira Loma, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 10/709,397

(22) Filed: May 1, 2004

(65) Prior Publication Data

US 2004/0262786 A1    Dec. 30, 2004

Related U.S. Application Data

(60) Provisional application No. 60/475,040, filed on Jun. 2, 2003, provisional application No. 60/521,259, filed on Mar. 21, 2004.

(51) Int. Cl.
*H02M 1/00*    (2006.01)

(52) U.S. Cl. .................. 363/141; 363/144; 361/699; 257/105

(58) Field of Classification Search ........ 363/141–145; 257/909, 688, 699, 709, 717–724
See application file for complete search history.

(56) References Cited

U.S. PATENT DOCUMENTS 3,921,201 A * 11/1975 Eisele et al. ................. 257/714
4,604,538 A * 8/1986 Merrill et al. ............. 310/68 D
6,327,407 B1 * 12/2001 Mitsuda et al. ................ 385/49

OTHER PUBLICATIONS

SEMTECH, High Current, High Density, Three Phase Full Wave Bridge Rectifier, Jan. 18, 1998, Publisher: Semtech Corp., 652 Mitchell Road, Newbury Park, CA 91320.

* cited by examiner

*Primary Examiner*—Rajnikant B. Patel
(74) *Attorney, Agent, or Firm*—Oppedahl & Olson LLP

(57) ABSTRACT

Hermetically sealed high-voltage assemblies are made up of series-connected diodes. Exposed tabs bonding adjacent diodes allow for greater thermal dissipation than previous products. This allows higher current-carrying capacity especially if used in oil.

21 Claims, 4 Drawing Sheets

DIODE STACK

This application claims priority from U.S. application Ser. No. 60/475,040, filed Jun. 2, 2003, and from U.S. application Ser. No. 60/521,259, filed Mar. 21, 2004, which applications are incorporated herein by reference for all purposes.

BACKGROUND

Given the many pressures and constraints imposed upon the designer, it is not easy to make high-performance rectifiers. It is desired to make rectifiers that are capable of accommodating high voltages and high currents. It is desired that the rectifiers satisfy a small form factor. It is necessary that the rectifiers somehow dissipate heat despite the small form factor.

Historically among the first rectifiers were vacuum tubes with two active electrodes; they were called "diodes" with the root "di-" connoting two active electrodes rather than some other number of active electrodes. Semiconductor diodes came into use many decades ago, for example the selenium rectifier with metal cooling plates shown in FIG. 13.

FIG. 1 is a schematic diagram of a prior-art three-phase bridge rectifier 50. Diodes 13, of which there are six in this figure, form the bridge. Three-phase alternating current is provided to the bridge 50 by means of leads 12. Direct current is produced at leads 10, 11.

FIG. 2 is a schematic diagram of a prior-art single-phase full-wave bridge rectifier 51. Diodes 13, of which there are four in this figure, form the bridge. Single-phase full-wave alternating current is provided to the bridge 51 by means of leads 12. Direct current is produced at leads 10, 11.

It will be appreciated that rectifier 51 is a special case of rectifier 50; if two phases of alternating current are provided to two of the leads 12 of rectifier 50, the electrical result is the same as that portrayed in rectifier 51.

Experience with semiconductor diodes teaches that a given semiconductor diode will have some limit to the reverse voltage which can be tolerated by the diode. In addition, depending on the amount of cooling available, the diode will have some limit to the amount of current which it can carry. When it is desired to provide a rectifier that can tolerate very high reverse voltage, a series-configured diode arrangement may be used such as is shown in FIG. 3.

Where it is desired to provide a rectifier that can carry high current, one option is to use a very wide diode, that is, a diode that has a large cross-section. This is the approach used in a high-current selenium rectifier such as that shown in FIG. 13. There are drawbacks, however, that arise if one attempts to make a physically large semiconductor diode, among them potential problems with fabrication as well as conduction of heat away from the diode junction. For these reasons it is known to build up a rectifier of a desired current-carrying capacity by putting two or more diodes in parallel as shown in FIG. 4. It will be appreciated that in such an arrangement it is extremely important that the diodes be well matched, for example having as close to identical forward voltage drops as possible. (Otherwise one of the diodes is likely to conduct substantially more current than its neighbors and may fail.)

FIGS. 5a, 5b, and 5c show side, top, and perspective views of a prior-art three-phase bridge rectifier. This can, for example, be a Semtech SET111403 rectifier. Tabs 21, 22, 23 are connected to three-phase alternating current. Diodes 24, 25, 26, 28, 29, 30, being six in number, serve to rectify the alternating current. Direct current is available at tabs 20, 27. The assembly can be electrically isolated for direct heat-sink mounting.

FIG. 6 is a top view of a prior-art series-configured rectifier 54. This can be a Semtech SCH5000 rectifier. The device 54 has two leads 31, 32. Body 33 is typically made of an insulating plastic such as epoxy. The thermal conductivity of the epoxy is one of several factors influencing the ability of the rectifier 54 to dissipate waste heat. The internal construction of the rectifier 54 may be seen in FIG. 10, which will be discussed in more detail below. Diodes 60 are disposed in series, connected by leads 61.

It will be appreciated that it is very desirable to arrive at a rectifier configuration that can tolerate high voltages, that fits into a small form factor, and that offers very good thermal dissipation as compared with prior-art rectifiers, especially if used in oil. It is desired if such a rectifier configuration can be inexpensive, can have low forward voltage drop, can have low reverse leakage current, can have high thermal shock resistance, can provide corona-free construction, and can have low distributed capacitance.

SUMMARY OF THE INVENTION

Hermetically sealed high-voltage assemblies are made up of series-connected diodes. Exposed tabs bonding adjacent diodes allow for greater thermal dissipation than previous products. This allows higher current-carrying capacity especially if used in oil.

DESCRIPTION OF DRAWINGS

The invention will be described by reference to a drawing in several figures.

FIG. 10 compares the form factors of a prior-art series-configured rectifier such as that of FIG. 6 with a series-configured rectifier according to the invention such as that of FIG. 7a.

DETAILED DESCRIPTION

Figure 7A:
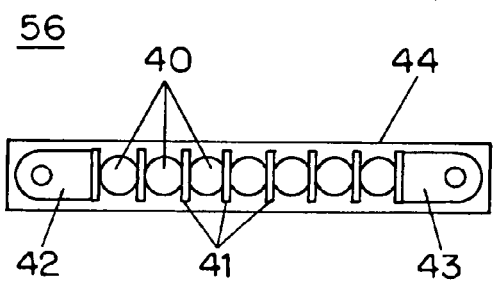
FIGS. 7a, 7b, and 7c show top, side, and perspective views of a rectifier according to an embodiment of the invention.
Figure 7B:
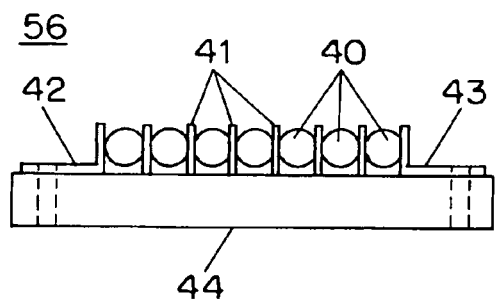
Figure 7C:
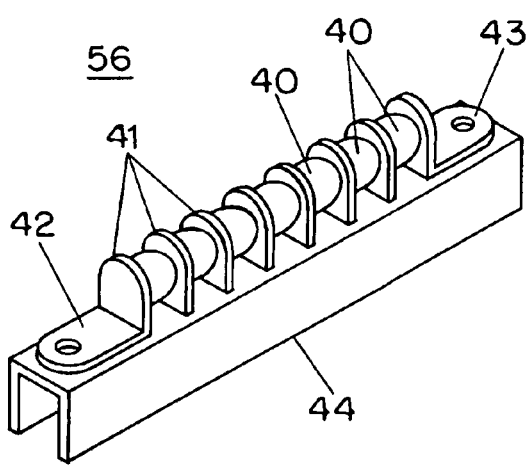

FIGS. 7a, 7b, and 7c show top, side, and perspective views of a rectifier 56 according to an embodiment of the invention. In this rectifier, diodes 40 are connected in series to provide high voltage ratings. The diodes are preferably hermetically sealed silicon diodes. Stated more generally, diodes well suited for this application are diodes employing wide-gap semiconductors.

Importantly, the diodes 40 are connected using plates 41 that act as heat sinks. This allows for better thermal transfer and heat dissipation to air or other cooling media such as oil. A metal well suited for such plates is copper.

Stated differently, what is provided is a rectifier assembly 56 comprising a plurality of semiconductor diodes 40, each diode 40 having an axis defined by an anode and a cathode, with the diodes 40 disposed in an axial linear array along the length of the assembly 56. Each two axially adjacent diodes 40 are electrically and mechanically connected to each other by a metal plate 41, each of the diodes connected to the metal plate by solder material as mentioned below, each such connection using a full diode end surface as discussed below in connection with FIG. 9. The metal plates are fixed in relative position by a mounting block 44. Rather than being potted as in some prior-art rectifier assemblies, each diode 40 is exposed to surrounding fluid except at its end surfaces. As may be appreciated from the figures, the mounting block 44 is elongated along an axis parallel to and distanced from the axis of the linear array. The distance between the two axes is greater than the radius of the diodes.

The interconnections are desirably made using high-temperature solder material, for example having a melt point greater than 275 degrees C. This allows the assemblies to operate at ambient temperatures greater than 175 degrees C. and allows storage at temperatures as great as 200 degrees C. Typical temperature ratings for such assemblies in use are at 150 degrees C. and below.

In one typical application, each two adjacent diodes 40 are connected anode-to-cathode. This assembly comprises a two-terminal high-voltage rectifier.

The diodes of the assembly may be cooled by a surrounding fluid of air or a surrounding fluid of oil.

Figure 5A:
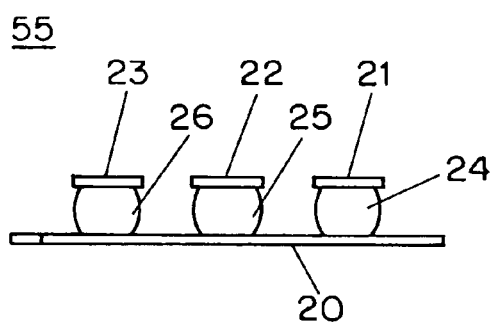
FIGS. 5a, 5b, and 5c show side, top, and perspective views of a prior-art three-phase bridge rectifier.
Figure 5B:
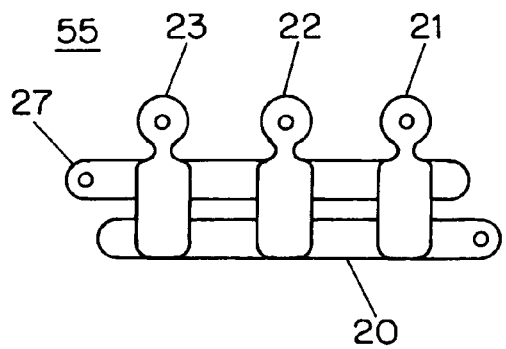
Figure 5C:
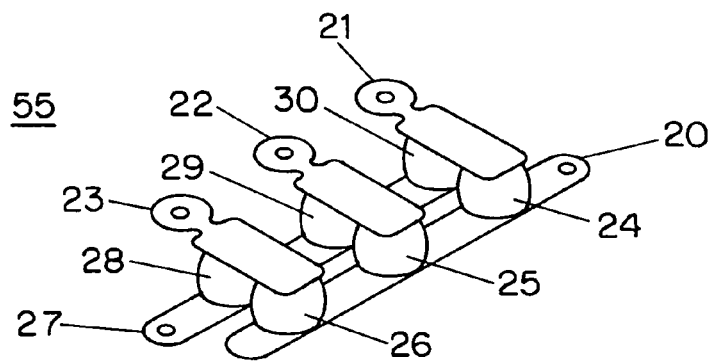

One way to characterize the arrangement of FIGS. 7a, 7b and 7c is to say that each diode 40 defines a respective plane perpendicular to its axis, and that for each diode 40 of the assembly, no other diode of the assembly lies within its respective plane. This differs, for example, from the arrangement down in FIGS. 5a, 5b, and 5c where each diode has at least one other diode in its respective plane. Indeed in FIGS. 5a, 5b and 5c it will be appreciated that all six diodes portrayed are coplanar, each lying within the respective plane of five other diodes. The path of cooling fluid through the arrangement of FIGS. 5a, 5b and 5c is circuitous, and cooling fluid reaching one diode may have already passed by some other diode and been heated by it. In contrast the path of cooling fluid in the arrangement of FIGS. 7a, 7b and 7c can be less circuitous, especially if the direction of flow is perpendicular to the axis of the arrangement. This can offer better heat transfer.

Figure 8:
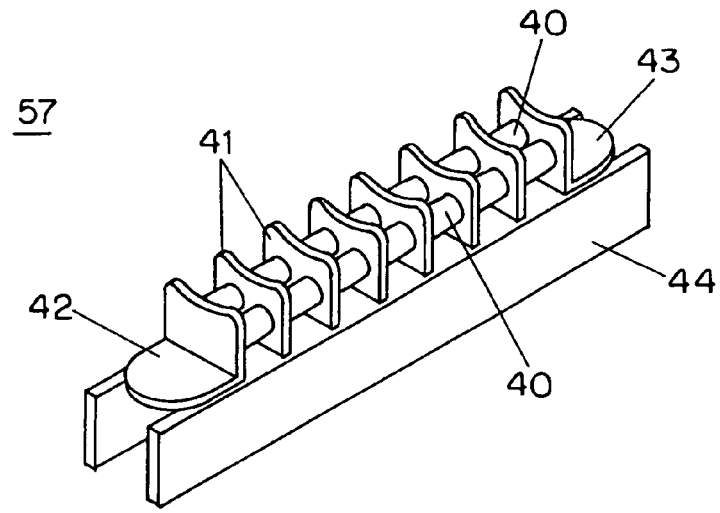
FIG. 8 is a perspective view of a series-parallel configuration according to an embodiment of the invention.

FIG. 8 is a perspective view of a series-parallel configuration 57 according to an embodiment of the invention. In this rectifier, diodes 40 which are hermetically sealed, and which are matched according to forward voltage drop, are paralleled to produce large current capabilities.

Described differently, the arrangement 57 comprises m times n semiconductor diodes, where n is at least two. (In FIG. 8, m is 7 and n is 2.) Each diode 40 has an axis defined by an anode and a cathode. The diodes 40 are disposed in n axial parallel linear arrays of m diodes. Each two axially adjacent diodes 40 are electrically and mechanically connected to each other by a metal plate 41. Each metal plate 41 extends to form a part of each of the n axial arrays, each metal plate thus contacting on one face with n diodes and contacting on its other face with n diodes.

In the particular arrangement of FIG. 8, each two axially adjacent diodes 40 are connected anode-to-cathode, and each metal plate 41 thus contacts on once face with anodes of diodes and contacts on its other face with cathodes of diodes. In this way the assembly comprises a two-terminal high-voltage rectifier with high current capacity.

One way to characterize the geometry of the arrangement of FIG. 8 is to say that each diode defines a respective plane perpendicular to its axis, and for each diode of the assembly, n-1 other diodes of the assembly lie within its respective plane. So for the special case where n is 2 (as depicted in FIG. 8) for each diode, one other diode lies within its respective plane.

Figure 9:
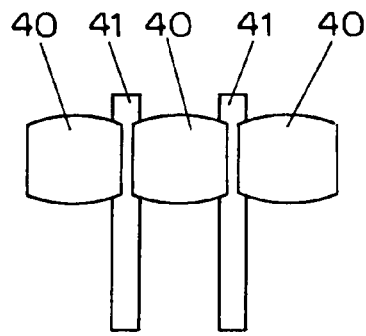
FIG. 9 is a detail side view of a series configuration of diodes according to an embodiment of the invention.

FIG. 9 is a detail side view of a series configuration of diodes according to an embodiment of the invention. It will be appreciated that the interconnections between the diodes 40 use the full end surface of the diode 40, rather than a mere lead connection as is seen in diode 54 in FIG. 10. Plates 41 serve as heat sinks as well as electrical connectors. Each plate 41 can optionally be inset slightly on both faces as depicted, thereby helping to keep the diodes 40 in place during assembly and thereafter. Alternatively, each plate 41 could be inset on one side only, as an aid to assembly. Finally, each plate 41 could be flat on both faces, thus reducing the fabrication cost of the plates 41.

Figure 1:
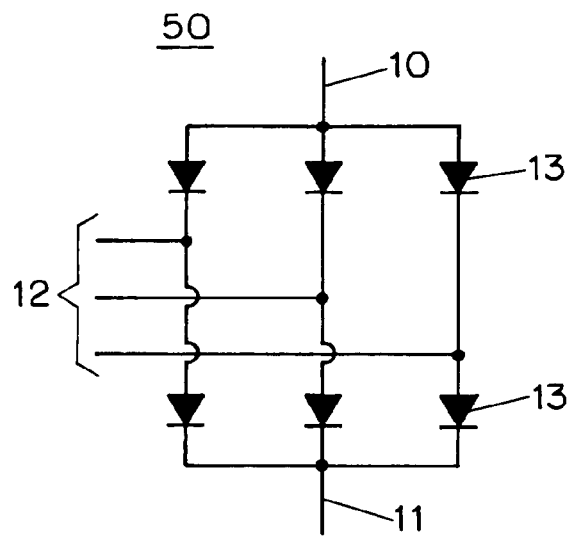
FIG. 1 is a schematic diagram of a prior-art three-phase bridge rectifier.
Figure 2:
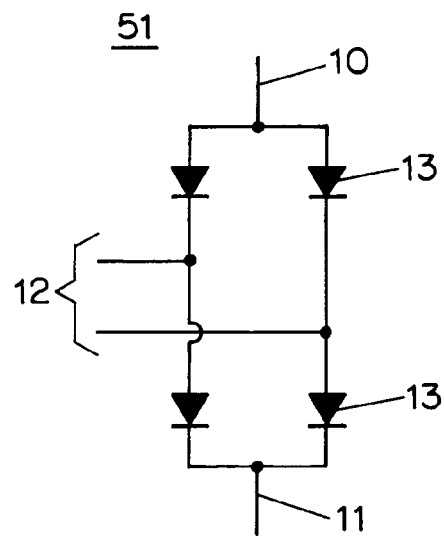
FIG. 2 is a schematic diagram of a prior-art single-phase full-wave bridge rectifier.
Figure 3:
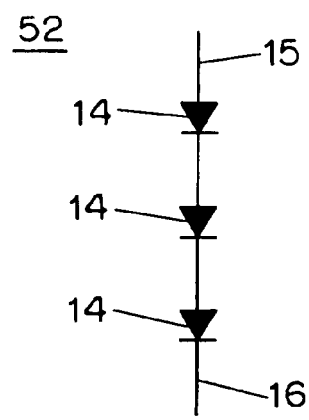
FIG. 3 is a schematic diagram showing a prior-art series-configured rectifier optimized for high voltage.
Figure 4:
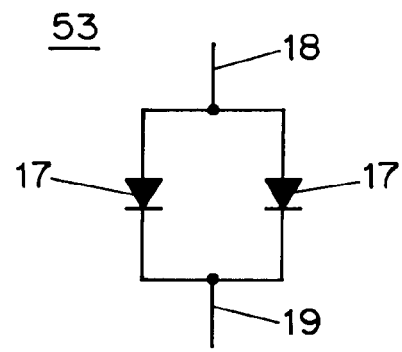
FIG. 4 is a schematic diagram showing a prior-art parallel-configured rectifier optimized for high current.
Figure 6:
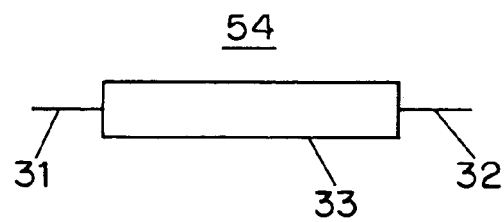
FIG. 6 is a top view of a prior-art series-configured rectifier.
Figure 10:
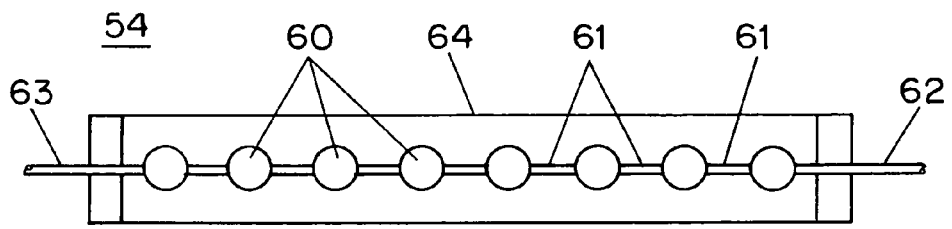
Figure 10:
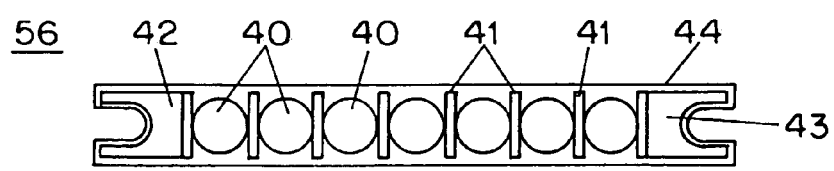

FIG. 10 compares the form factors of a prior-art series-configured rectifier such as that of FIG. 6 with a series-configured rectifier according to the invention such as that of FIG. 7a. It will be appreciated that a rectifier with a given voltage and current rating when arranged according to the invention can satisfy a much smaller form factor as compared with a rectifier according to the prior art.

The end connectors for the rectifier 56 may be of different types depending on whether electrical isolation is needed. Thus for example the mechanical mounting may be by means of mounting holes which are electrically isolated from the end electrical contact points 42, 43.

Figure 11:
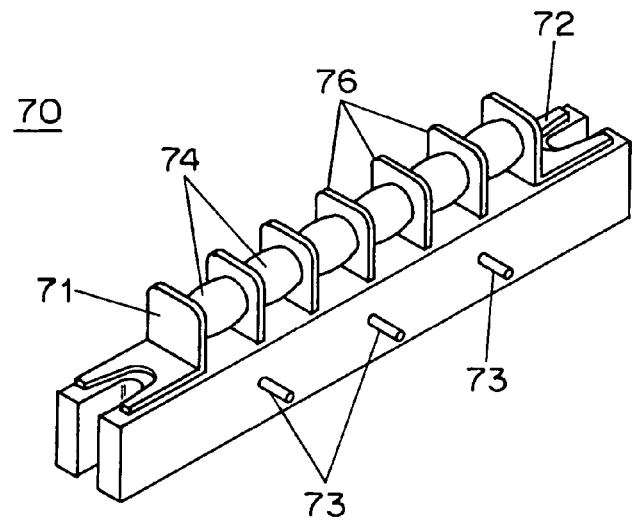
FIG. 11 is a perspective view of a three-phase bridge rectifier according to an embodiment of the invention.
Figure 12:
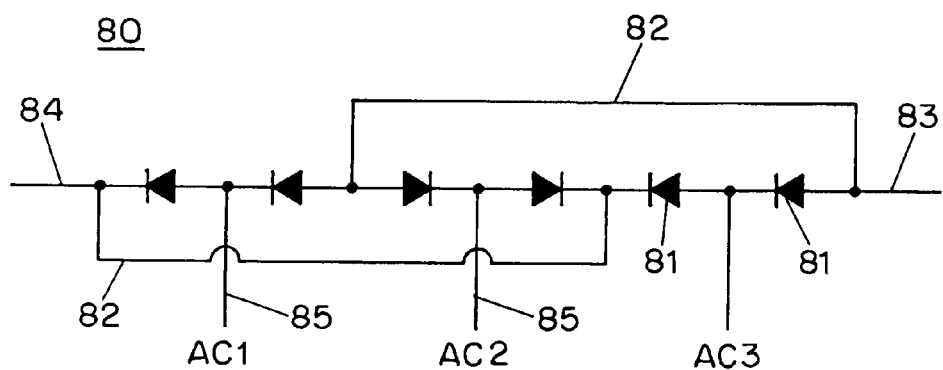
FIG. 12 is a schematic diagram of the bridge rectifier of FIG. 11, showing internal interconnections.
Figure 13:
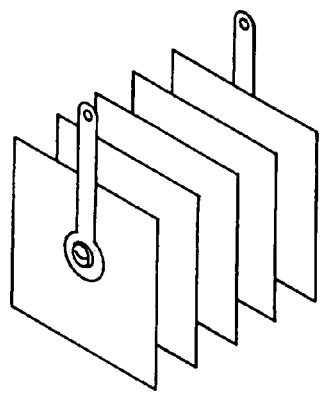
FIG. 13 is a perspective view of a prior-art selenium rectifier with metal cooling plates.

FIG. 11 is a perspective view of a three-phase bridge rectifier 70 according to an embodiment of the invention. Side contacts 73 are the points of connection for AC power while end contacts 71, 72 provide direct current. FIG. 12 is a schematic diagram of the bridge rectifier of FIG. 11, showing internal interconnections 82 as well as AC contacts 85 and DC contacts 83, 84.

Stated differently, in the rectifier assembly 70, the number of diodes 40 is a multiple of six, and interconnections are provided with the metal plates 76, whereby the assembly comprises a three-phase bridge rectifier. The number can be exactly six, as shown in FIG. 11, or diodes can be paralleled as shown in FIG. 8, in which case the number of diodes is some multiple of six, for example twelve diodes.

The rectifier 56 of FIG. 7a is able to provide 12 kilovolts of working reverse voltage, in a package that is only 3.2 inches long. It can provide 5 Kilovolts of working reverse voltage in a package only 1.8 inches long. In still oil at 55 degrees C. the rectifier can carry eight amperes of forward current. In air at 55 degrees C. the rectifier can carry 1.6 amperes of forward current.

In contrast a prior-art rectifier of FIG. 6 and comparable form factor might be able to carry only one ampere of forward current in still oil at 55 degrees C., and only half an ampere in air at 55 degrees C.

It will be appreciated, then, that the invention offers, in a high-voltage rectifier, a much higher current-carrying capacity for a given form factor.

Those skilled in the art will have no difficulty devising myriad obvious improvements and variants upon the invention, none of which depart from the invention and all of which are intended to be encompassed within the scope of the claims which follow.

The invention claimed is:

1. A rectifier assembly comprising:
a plurality of semiconductor diodes, each diode having an axis defined by an anode and a cathode;
the diodes disposed in an axial linear array;
each two axially adjacent diodes electrically and mechanically connected to each other by a metal plate, each of the diodes connected to the metal plate by solder material, each such connection using a full diode end surface;
the metal plates fixed in relative position by a mounting block;
each diode exposed to surrounding fluid except at its end surfaces.

2. The rectifier assembly of claim 1 wherein each two adjacent diodes are connected anode-to-cathode, whereby the assembly comprises a two-terminal high-voltage rectifier.

3. The rectifier assembly of claim 1 wherein the surrounding fluid is air.

4. The rectifier assembly of claim 1 wherein the surrounding fluid is oil.

5. The rectifier assembly of claim 1 wherein the number of diodes is a multiple of six, and wherein interconnections are provided with the metal plates, whereby the assembly comprises a three-phase bridge rectifier.

6. The rectifier assembly of claim 1 wherein the solder material is high temperature solder material.

7. The rectifier assembly of claim 6 wherein the high temperature solder material has a melt point greater than 275 degrees C.

8. The rectifier assembly of claim 1 wherein the diodes are hermetically sealed diodes.

9. The rectifier assembly of claim 1 wherein the diodes are silicon diodes.

10. The rectifier assembly of claim 1 wherein each diode defines a respective plane perpendicular to its axis, and wherein for each diode of the assembly, no other diode of the assembly lies within its respective plane.

11. A rectifier assembly comprising:
m times n semiconductor diodes, each diode having an axis defined by an anode and a cathode, n being at least two;
the diodes disposed in n axial parallel linear arrays of m diodes;
each two axially adjacent diodes electrically and mechanically connected to each other by a metal plate, each of the diodes connected to the metal plate by high-temperature solder material, each such connection using a full diode end surface, each metal plate extending to form a part of each of the n axial arrays, each metal plate thus contacting on one face with n diodes and contacting on its other face with n diodes;
the metal plates fixed in relative position by a mounting block;
each diode exposed to surrounding fluid except at its end surfaces.

12. The rectifier assembly of claim 11 wherein each two axially adjacent diodes are connected anode-to-cathode, and wherein each metal plate thus contacts on once face with anodes of diodes and contacts on its other face with cathodes of diodes, whereby the assembly comprises a two-terminal high-voltage rectifier.

13. The rectifier assembly of claim 11 wherein the surrounding fluid is air.

14. The rectifier assembly of claim 11 wherein the surrounding fluid is oil.

15. The rectifier assembly of claim 11 wherein the number of diodes is a multiple of six, and wherein interconnections are provided with the metal plates, whereby the assembly comprises a three-phase bridge rectifier.

16. The rectifier assembly of claim 11 wherein the solder material is high temperature solder material.

17. The rectifier assembly of claim 16 wherein the high temperature solder material has a melt point greater than 275 degrees C.

18. The rectifier assembly of claim 11 wherein the diodes are hermetically sealed diodes.

19. The rectifier assembly of claim 11 wherein the diodes are silicon diodes.

20. The rectifier assembly of claim 11 wherein each diode defines a respective plane perpendicular to its axis, and wherein for each diode of the assembly, n-1 other diodes of the assembly lie within its respective plane.

21. The rectifier assembly of claim 11 wherein n is two.

* * * * *